(12) United States Patent
Motegi et al.

(10) Patent No.: US 9,745,465 B2
(45) Date of Patent: Aug. 29, 2017

(54) RESIN COMPOSITION FOR LASER DIRECT STRUCTURING, RESIN-MOLDED ARTICLE, AND METHOD FOR MANUFACTURING MOLDED ARTICLE WITH PLATED LAYER

(71) Applicant: MITSUBISHI ENGINEERING-PLASTICS CORPORATION, Tokyo (JP)

(72) Inventors: Atsushi Motegi, Hiratsuka (JP); Hiroyoshi Maruyama, Hiratsuka (JP)

(73) Assignee: MITSUBISHI ENGINEERING-PLASTICS CORPORATION, Tokyo (JP)

( * ) Notice: Subject to any disclaimer, the term of this patent is extended or adjusted under 35 U.S.C. 154(b) by 762 days.

(21) Appl. No.: 14/129,221

(22) PCT Filed: Jun. 5, 2013

(86) PCT No.: PCT/JP2013/066129
§ 371 (c)(1),
(2) Date: Dec. 24, 2013

(87) PCT Pub. No.: WO2013/183789
PCT Pub. Date: Dec. 12, 2013

(65) Prior Publication Data
US 2014/0162070 A1 Jun. 12, 2014

(30) Foreign Application Priority Data

Jun. 6, 2012 (JP) ................................. 2012-128619
Jun. 6, 2012 (JP) ................................. 2012-128621

(51) Int. Cl.
| | |
|---|---|
| C08L 69/00 | (2006.01) |
| C08L 47/00 | (2006.01) |
| H01Q 1/22 | (2006.01) |
| C08K 3/40 | (2006.01) |
| C08K 7/14 | (2006.01) |
| C08K 9/06 | (2006.01) |
| C08L 83/04 | (2006.01) |
| H05K 3/18 | (2006.01) |
| B41C 1/05 | (2006.01) |
| B41M 5/26 | (2006.01) |
| C08G 77/12 | (2006.01) |

(52) U.S. Cl.
CPC .............. C08L 69/00 (2013.01); C08K 3/40 (2013.01); C08K 7/14 (2013.01); C08K 9/06 (2013.01); C08L 47/00 (2013.01); C08L 83/04 (2013.01); H01Q 1/22 (2013.01); H05K 3/185 (2013.01); B41C 1/05 (2013.01); B41M 5/267 (2013.01); C08G 77/12 (2013.01); H05K 2203/107 (2013.01); Y10T 29/49016 (2015.01); Y10T 428/31507 (2015.04)

(58) Field of Classification Search
CPC ............ C08L 69/00; C08L 47/00; H01Q 1/22
See application file for complete search history.

(56) References Cited

U.S. PATENT DOCUMENTS

| | | | |
|---|---|---|---|
| 4,431,764 A * | 2/1984 | Yoshizumi ................ | C09C 1/00 252/519.33 |
| 2002/0111409 A1* | 8/2002 | Talibuddin ............... | C08K 3/22 524/417 |
| 2002/0134771 A1 | 9/2002 | Wenger et al. | |
| 2002/0165300 A1 | 11/2002 | Fujiguchi et al. | |
| 2009/0292048 A1* | 11/2009 | Li .......................... | C08L 55/02 524/115 |

FOREIGN PATENT DOCUMENTS

| | | | |
|---|---|---|---|
| CN | 1240759 C | 2/2006 | |
| DE | 10 2004 045 305 A1 | 3/2006 | |
| JP | 2013-144768 A | 7/2013 | |
| KR | 10-0683327 B1 | 2/2007 | |
| WO | WO 00/39210 A1 | 7/2000 | |
| WO | WO 2006/029677 A1 | 2/2006 | |
| WO | WO 2009/141799 A1 | 11/2009 | |
| WO | WO 2011/076729 A1 | 6/2011 | |
| WO | WO 2011/076730 A1 | 6/2011 | |
| WO | WO 2011/095632 A1 | 8/2011 | |
| WO | WO 2012/056416 A1 * | 5/2012 | ............... C08K 9/02 |
| WO | WO 2012/056416 A1 | 5/2012 | |
| WO | WO 2012056416 A1 * | 5/2012 | ............ H05K 3/185 |
| WO | WO 2014/042282 A1 | 3/2014 | |

OTHER PUBLICATIONS

European Office Action dated Oct. 14, 2014, issued in corresponding European Patent Application No. 13 731 511.5.
European Office Action, dated Oct. 14, 2014, for European Application No. 13731511.5.
International Preliminary Report on Patentability and Written Opinion of the International Searching Authority (Forms PCT/IB/326, PCT/IB373 and PCT/ISA/237), dated Dec. 18, 2014, for International Application No. PCT/JP2013/066129.
Japanese Office Action, issued Sep. 2, 2014, for Japanese Application No. 2014-530489.
Korean Office Action, issued Aug. 13, 2014, for Korean Application No. 10-2014-7018103, along with English translation.

(Continued)

*Primary Examiner* — Robert Harlan
(74) *Attorney, Agent, or Firm* — Birch, Stewart, Kolasch & Birch, LLP

(57) ABSTRACT

Provided is a resin composition excellent in mechanical strength while maintaining LDS activity. The resin composition for laser direct structuring comprises, relative to 100 parts by weight of a polycarbonate resin component, 10 to 100 parts by weight of a glass filler and 1 to 30 parts by weight of a laser direct structuring additive, wherein the polycarbonate resin component consists of 80 to 30% by weight of a polycarbonate resin and 20 to 70% by weight of a styrene-based resin, or consists of a polycarbonate; and the laser direct structuring additive comprises antimony and tin.

17 Claims, 1 Drawing Sheet

(56) References Cited

OTHER PUBLICATIONS

Chinese Office Action and Search Report, dated Dec. 22, 2014, for Chinese Application No. 201380004487.4, with partial English translation.
Korean Office Action, dated Dec. 9, 2014, for Korean Application No. 10-2014-7018103, with English translation.
International Search Report and Written Opinion of the International Searching Authority issued in PCT/JP2013/066129 on Sep. 2, 2013.
Korean Notice of Final Rejection and English translation thereof, dated Apr. 8, 2015, for Korean Application No. 10-2014-7018103.
Korean Office Action, dated Aug. 20, 2015, for Application No. 10-2015-7018435, with an English translation.

* cited by examiner

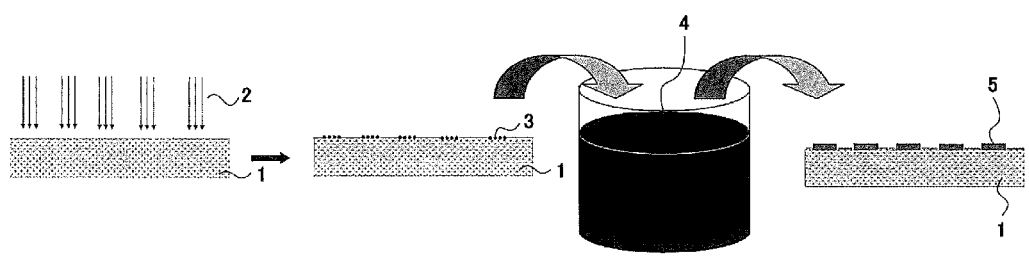

RESIN COMPOSITION FOR LASER DIRECT STRUCTURING, RESIN-MOLDED ARTICLE, AND METHOD FOR MANUFACTURING MOLDED ARTICLE WITH PLATED LAYER

TECHNICAL FIELD

The present invention relates to a resin composition for laser direct structuring (hereinafter may be simply referred to as "resin composition"). Furthermore, the present invention relates to a resin-molded article produced by molding the resin composition, and a method for manufacturing a resin-molded article with a plated layer formed on the surface of the resin-molded article.

BACKGROUND ART

Recently, along with the development of cellular phones including smart phone, various methods for manufacturing an antenna inside the cellular phone have been studied. Particularly, a method for manufacturing the antenna which can be three-dimensionally designed in the cellular phones is required. As one of the techniques to form the three-dimensional antenna, attention is paid to laser direct structuring (hereinafter may be referred to as "LDS") technique. The LDS technique is a technique, for example, in which a surface of a resin-molded article containing an LDS additive is irradiated with a laser, only the portion irradiated with the laser is activated, and a plated layer is formed by application of a metal to the activated portion. The feature of this technique is to manufacture a metallic structure such as an antenna directly on a surface of resin substrate without using an adhesive or the like. Such LDS techniques are disclosed in, for example, WO 2011/095632 A, WO 2011/076729 A and WO 2011/076730 A and the like.

SUMMARY OF INVENTION

Technical Problem

Here, as a result of studying the resin compositions described in the above-mentioned Patent Literatures 1 to 3, it has been found that the compositions are inferior in mechanical strength. The object of the present invention is to solve the problems of the above conventional technique, and is to provide a resin composition excellent in mechanical strength (bending strength, bending modulus, charpy impact strength (with and without notches) while maintaining LDS activity.

Solution to Problem

Under such circumstances, as a result of intensive studies by the present inventors, it has been found that when the amount of glass filler is increased, although the mechanical properties are enhanced, the LDS activity is lowered. Then, it has also be found that, by controlling the amount of the glass filler and the amount of the LDS additive, a resin composition being excellent in mechanical strength while maintaining the LDS activity can be provided, and then the present invention has been completed. Specifically, the above-mentioned problems have been solved by the means <1>, preferably by <2> to <18> mentioned below.
<1> A resin composition for laser direct structuring, comprising, relative to 100 parts by weight of a polycarbonate resin component, 10 to 100 parts by weight of a glass filler and 1 to 30 parts by weight of a laser direct structuring additive,
wherein the polycarbonate resin component consists of 100 to 30% by weight of a polycarbonate resin and 0 to 70% by weight of a styrene-based resin; and
the laser direct structuring additive comprises antimony.
<2> The resin composition for laser direct structuring according to <1>, wherein the polycarbonate resin component consists of 80 to 30% by weight of a polycarbonate resin and 20 to 70% by weight of a styrene-based resin, or consists of a polycarbonate.
<3> The resin composition for laser direct structuring according to <1> or <2>, further comprising 1 to 30 parts by weight of a talc, relative to 100 parts by weight of the polycarbonate resin component.
<4> The resin composition for laser direct structuring according to any one of <1> to <3>, further comprising 0.01 to 5 parts by weight of at least one kind selected from polyorganohydrogensiloxanes and organopolysiloxanes, relative to 100 parts by weight of the polycarbonate resin component.
<5> The resin composition for laser direct structuring according to <1> or <2>, further comprising 1 to 30 parts by weight of a talc surface-treated with at least one kind selected from polyorganohydrogensiloxanes and organopolysiloxanes, relative to 100 parts by weight of the polycarbonate resin component.
<6> The resin composition for laser direct structuring according to any one of <1> to <5>, wherein the glass filler is at least one kind selected from a glass fiber and a plate-like glass.
<7> The resin composition for laser direct structuring according to any one of <1> to <5>, wherein the glass filler is at least one kind selected from a glass flake and a flat glass fiber.
<8> The resin composition for laser direct structuring according to any one of <1> to <7>, further comprising 1 to 20 parts by weight of an elastomer, relative to 100 parts by weight of the polycarbonate resin component.
<9> The resin composition for laser direct structuring according to any one of <1> to <8>, further comprising 1 to 40 parts by weight of a white pigment, relative to 100 parts by weight of the polycarbonate resin component.
<10> The resin composition for laser direct structuring according to <9>, wherein the white pigment is titanium oxide and/or zinc sulfide.
<11> The resin composition for laser direct structuring according to any one of <1> to <10>, further comprising 0.01 to 5 parts by weight of a phosphorus-based stabilizer, relative to 100 parts by weight of the polycarbonate resin component.
<12> The resin composition for laser direct structuring according to any one of <1> to <11>, wherein the laser direct structuring additive is an oxide comprising copper and chromium.
<13> A resin-molded article obtained by molding the resin composition for laser direct structuring according to any one of <1> to <12>.
<14> The resin-molded article according to <13>, further comprising a plated layer on a surface of the article.
<15> The resin-molded article according to <13> or <14>, which is a mobile electronic device part.
<16> The resin-molded article according to <14> or <15>, wherein the plated layer has a performance as an antenna.
<17> A method for manufacturing a resin-molded article with a plated layer, irradiating, with laser, a surface of the resin-molded article obtained by molding the resin composition for laser direct structuring according to any one of <1> to <12>, and applying a metal on the surface to form the plated layer.
<18> The method for manufacturing a resin-molded article with a plated layer according to <17>, wherein the plating is copper plating.
<19> A method for manufacturing a mobile electronic device part having an antenna, comprising the method for manufacturing a resin-molded article with a plated layer according to <17> or <18>.

Effects of Invention

According to the present invention, it becomes possible to provide a resin composition excellent in mechanical strength (bending strength, bending modulus, charpy impact strength (with and without notches) while maintaining LDS activity.

BRIEF DESCRIPTION OF DRAWINGS

FIG. 1 is a schematic view showing a process of providing a plated layer on a surface of resin-molded article. In FIG. 1, numeral 1 designates a resin-molded article, 2 designates a laser, 3 designates a portion irradiated with the laser, 4 designates a plating solution, 5 designates a plated layer, respectively.

DESCRIPTION OF EMBODIMENTS

In the following, the content of the present invention will be specifically explained. Note that, in the present Description, the expression "to" is used to mean that the former numerical value and the latter numerical value are included as the upper limit value and the lower limit value, respectively.

The present invention is characterized by that the resin composition for laser direct structuring comprises, relative to 100 parts by weight of a polycarbonate resin component, 10 to 100 parts by weight of a glass filler and 5 to 40 parts by weight of a laser direct structuring additive, wherein the polycarbonate resin component consists of 80 to 30% by weight of a polycarbonate resin and 20 to 70% by weight of a styrene-based resin, or consists of a polycarbonate; and the laser direct structuring additive comprises antimony and tin.

In the following, the resin composition according to the present invention will be specifically explained.
<Polycarbonate Resin Component>

The polycarbonate resin component in the present invention consists of 100 to 30% by weight of a polycarbonate resin and 0 to 70% by weight of a styrene-based resin. The polycarbonate resin component in the present invention preferably consists of 80 to 30% by weight of a polycarbonate resin and 20 to 70% by weight of a styrene-based resin, or consists of a polycarbonate.

The preferable first embodiment is that the polycarbonate resin component consists of 80 to 30% by weight of a polycarbonate resin and 20 to 70% by weight of a styrene-based resin. The polycarbonate resin component in the first embodiment may comprise only one kind of the styrene-based resin, or may comprise two or more kinds. The polycarbonate resin component in the first embodiment may comprise only one kind of the polycarbonate resin, or may comprise two or more kinds. In the polycarbonate resin component of the first embodiment, a proportion of the styrene-based resin is 20 to 70% by weight, preferably 25 to 55% by weight, and more preferably 30 to 48% by weight.

In the polycarbonate resin component of the first embodiment, a proportion of the polycarbonate resin is 80 to 30% by weight, preferably 75 to 45% by weight, and more preferably 70 to 52% by weight.

The preferable second embodiment is that the polycarbonate resin component consists of polycarbonate resin.

The polycarbonate resin component in the second embodiment may comprise only one kind of the polycarbonate resin, or may comprise two or more kinds.

In addition, the resin composition concerning both of the first and second embodiments may comprise other resin components within the scope not departing from the gist of the present invention. The other resin is preferably 5% by weight or less in the whole resin components.

In the resin composition of the present invention, a proportion of all resin including the polycarbonate resin component is preferably 20 to 90% by weight, more preferably 30 to 80% by weight, and further preferably 40 to 75% by weight.
<Polycarbonate Resin>

The polycarbonate resin used in the present invention is not particularly limited, and there can be used any of an aromatic polycarbonate, an aliphatic polycarbonate, an aromatic-aliphatic polycarbonate. Among them, the aromatic polycarbonate is preferable, and more preferable is a thermoplastic aromatic polycarbonate polymer or copolymer obtained by causing an aromatic dihydroxy compound to react with phosgene or a diester of carbonic acid.

The aromatic dihydroxy compounds include 2,2-bis(4-hydroxyphenyl)propane (=bisphenol A), tetramethylbisphenol A, bis(4-hydroxyphenyl)-P-diisopropylbenzene, hydroquinone, resorcinol, 4,4-dihydroxydiphenyl, etc., and preferable is bisphenol A. Furthermore, in order to prepare a composition having high incombustibility, there can be used a compound in which one or more of a tetraalkylphosphonium sulfonate is bonded to the above-mentioned aromatic dihydroxy compound, or a polymer, oligomer or the like containing siloxane structure and having phenolic OH groups at both terminals.

Preferred polycarbonate resins used in the present invention comprise a polycarbonate resin derived from 2,2-bis(4-hydroxyphenyl)propane; and a polycarbonate copolymer derived from 2,2-bis(4-hydroxyphenyl)propane and other aromatic dihydroxy compound.

A molecular weight of the polycarbonate resin is a viscosity-average molecular weight calculated in terms of a viscosity of solution at a temperature of 25° C. when using methylene chloride as a solvent, and is preferably 14,000 to 30,000, more preferably 15,000 to 28,000, and further preferably 16,000 to 26,000. When the viscosity-average molecular weight is within the above-mentioned range, mechanical strength is good and moldability is also good, thus being preferable.

Method for preparing the polycarbonate resin is not particularly limited, and in the present invention, there can be used polycarbonate resins manufactured by any methods such as phosgene method (interfacial polymerization method) and melting method (interesterification method). In addition, in the present invention, there may be used a polycarbonate resin prepared through a process in which an amount of terminal OH groups is controlled after undergoing manufacturing process by the general melting method.

Moreover, the polycarbonate resin used in the present invention may be not only a polycarbonate resin as a virgin material, but also a polycarbonate resin recycled from used products, so called a polycarbonate resin materially recycled.

As to other polycarbonate resins used in the present invention, the description of, for example, paragraphs 0018 to 0066 of JP 2012-072338 A can be referred to, which is incorporated hereto.

<Styrene-Based Resin>

The polystyrene-based resin used for the present invention is exemplified by polystyrene resin, high-impact polystyrene resin (HIPS), acrylonitrile-styrene copolymer (AS resin), acrylonitrile-butadiene-styrene copolymer (ABS resin), acrylonitrile-styrene-acrylic rubber resin (ASA resin) and acrylonitrile-ethylene/propylene-based rubber-styrene copolymer (AES resin).

The styrene-based resin optionally used in the present invention is at least one kind polymer selected from the group consisting of styrene-based polymers produced from styrene-based monomers, copolymers produced by copolymerizing the styrene-based monomers with the other vinyl-based monomers copolymerizable with the styrene-based monomers, and copolymers produced by copolymerizing the styrene-based monomers in the presence of rubber polymers or copolymerizing the styrene-based monomers with the other vinyl-based monomers copolymerizable with the styrene-based monomers in the presence of rubber polymers. Among these styrene-based resins, preferred are the copolymers produced by copolymerizing the styrene-based monomers in the presence of rubber polymers or copolymerizing the styrene-based monomers with the other vinyl-based monomers copolymerizable with the styrene-based monomers in the presence of rubber polymers.

Specific examples of the styrene-based monomers include styrene, and styrene derivatives such as α-methyl styrene, p-methyl styrene, divinyl benzene, ethylvinyl benzene, dimethyl styrene, p-t-butyl styrene, bromostyrene and dibromostyrene. Among these styrene-based monomers, preferred is styrene. These styrene-based monomers may be used alone or in the form of a mixture of any two or more thereof.

Examples of the vinyl-based monomers copolymerizable with the styrene-based monomers include vinyl cyanide compounds such as acrylonitrile and methacrylonitrile; acrylic acid alkyl esters such as methyl acrylate, ethyl acrylate, propyl acrylate, butyl acrylate, amyl acrylate, hexyl acrylate, 2-ethylhexyl acrylate, octyl acrylate and cyclohexyl acrylate; methacrylic acid alkyl esters such as methyl methacrylate, ethyl methacrylate, propyl methacrylate, butyl methacrylate, amyl methacrylate, hexyl methacrylate, 2-ethylhexyl methacrylate, octyl methacrylate and cyclohexyl methacrylate; acrylic acid aryl esters such as phenyl acrylate and benzyl acrylate; methacrylic acid aryl esters such as phenyl methacrylate and benzyl methacrylate; epoxy group-containing acrylic acid esters or methacrylic acid esters such as glycidyl acrylate and glycidyl methacrylate; maleimide-based monomers such as maleimide, N,N-methyl maleimide and N-phenyl maleimide; and a, β-unsaturated carboxylic acids or anhydrides thereof such as acrylic acid, methacrylic acid, maleic acid, maleic anhydride, fumaric acid and itaconic acid.

Examples of the rubber polymer copolymerizable with the styrene-based monomer include polybutadiene, polyisoprene, styrene-butadiene random copolymers, styrene-butadiene block copolymers, acrylonitrile-butadiene copolymers, copolymers of acrylic acid alkyl ester or methacrylic acid alkyl ester and butadiene, polybutadiene-polyisoprene copolymers, copolymers of ethylene such as ethylene-isoprene random copolymers, ethylene-isoprene block copolymers, ethylene-butene random copolymers or ethylene-butene random block copolymers and a, β-unsaturated carboxylic acid ester, ethylene-vinyl acetate copolymers, ethylene-propylene-non-conjugated diene copolymers such as ethylene-propylene-hexadiene copolymer, acrylic rubbers, composite rubbers comprising polyorganosiloxane rubber and poly(alkyl acrylate) rubber or poly(alkyl(methacrylate) rubber.

Specific examples of the styrene-based resins include high-impact polystyrene (HIPS), acrylonitrile-styrene copolymer (AS resin), acrylonitrile-butadiene-styrene copolymer (ABS resin), methyl methacrylate-acrylonitrile-butadiene-styrene copolymer (MABS resin), acrylonitrile-styrene-acrylic rubber copolymer (ASA resin), acrylonitrile-ethylene/propylene-based rubber-styrene copolymer (AES resin), styrene-methyl methacrylate copolymer (MS resin) and styrene-maleic anhydride copolymer.

Among these styrene-based resins, preferred are acrylonitrile-styrene copolymer (AS resin), acrylonitrile-butadiene-styrene copolymer (ABS resin), acrylonitrile-styrene-acrylic rubber copolymer (ASA resin) and acrylonitrile-ethylene/propylene-based rubber-styrene copolymer (AES resin), more preferred are acrylonitrile-butadiene-styrene copolymer (ABS resin), acrylonitrile-styrene-acrylic rubber copolymer (ASA resin) and acrylonitrile-ethylene/propylene-based rubber-styrene copolymer (AES resin), and still more preferred is acrylonitrile-butadiene-styrene copolymer (ABS resin).

The above styrene-based resin may be produced by emulsion polymerization, solution polymerization, bulk polymerization, suspension polymerization or bulk/suspension polymerization. In the present invention, so-called styrene-based polymers or styrene-based random copolymers or block copolymers are preferably produced by bulk polymerization, suspension polymerization or bulk/suspension polymerization, while styrene-based graft copolymers are preferably produced by bulk polymerization, bulk/suspension polymerization or emulsion polymerization.

The acrylonitrile-butadiene-styrene copolymer (ABS resin) preferably used in the present invention is a mixture of a thermoplastic graft copolymer obtained by graft-polymerizing a butadiene rubber component with acrylonitrile and styrene, and an acrylonitrile-styrene copolymer. The content of the butadiene rubber component in the ABS resin is preferably 5 to 40% by weight, more preferably 10 to 35% by weight and still more preferably 13 to 25% by weight on the basis of 100% by weight of the ABS resin component. Also, the rubber particle diameter in the ABS resin is preferably 0.1 to 5 μm, more preferably 0.2 to 3 μm, still more preferably 0.3 to 1.5 μm and further still more preferably 0.4 to 0.9 μm. The distribution of the rubber particle diameters may be either a single-peak distribution or a multiple-peak distribution having a plurality of peaks.

<Glass Filler>

The resin composition of the present invention comprises a glass filler. The glass filler includes glass fiber, plate-like glass, glass beads, and glass flake.

The glass filler is made of glass composition such as A glass, C glass, and E glass, and particularly, the E glass (no alkaline glass) is preferable because it does not have an adverse effect on the resin components.

The glass fiber means a material which has a perfect circular or polygonal cross-sectional shape cut at a right angle in a length direction and has a fibrous appearance. In the glass fiber, an average fiber diameter of monofilament is usually 1 to 25 μm, preferably 5 to 17 μm. When the average fiber diameter is not less than 1 μm, moldability of the resin composition is further improved, and when the average fiber diameter is not more than 25 μm, the appearance of a resin-molded article is further improved and reinforcement effect also becomes more sufficient. The glass fiber may be a monofilament or a plurality of monofilament twisted threads.

The shape of the glass fibers may be any of "glass roving" obtained by winding continuously a monofilament or a plurality of monofilament twisted threads, "chopped strand" cut at a length of 1 to 10 mm, or "milled fiber" milled to powder having a length of about 10 to 500 µm. Such glass fibers can be commercially manufactured by ASAHI FIBER GLASS Co., Ltd. as a trade name of "Glasslon Chopped Strand" or "Glasslon Milled Fiber", and can be easily obtained. The glass fibers of different shapes can be used together.

In the present invention, a modified cross-section fiber is also preferably used as a glass fiber. The modified cross-section has, for example, a tire profile of 1.5 to 10, wherein the tire profile is shown as long diameter/short diameter (D2/D1) wherein the long diameter of the cross section perpendicular to the length direction of the fiber is D1 and the short diameter thereof is D2, of 1.5 to 10. Of those, the tire profile is preferably 2.5 to 10, further 2.5 to 8, particularly 2.5 to 5. Such a flattened glass may be referenced by JP2011-195820, the paragraphs 0065 to 0072 and the contents are incorporate by reference in the present specification.

Glass beads have a spherical shape having an external diameter of 10 to 100 µm, are marketed as a product name is "EGB731" from Potters Ballotini Co., Ltd., and are readily available. The glass flake has a scale-like shape having a thickness of 1 to 20 µm and a length in one side of 0.05 to 1 mm, is marketed, for example, as a product name is "flaka" from Asahi Glass Co., Ltd., and is readily available.

As long as the properties of the resin composition according to the present invention are not impaired, in order to enhance affinity to the resin component, these glass fibers may be, for example, a material surface-treated with a silane-based compound, an epoxy-based compound, a urethane-based compound and the like, or an oxidation-treated material.

A blending amount of the glass filler in the resin composition of the present invention is 10 to 100 parts by weight, preferably 10 to 85 parts by weight, more preferably 20 to 70 parts by weight, further preferably 30 to 65 parts by weight, and particularly preferably 40 to 60 parts by weight, relative to 100 parts by weight of the polycarbonate resin component.

The resin composition of the present invention may comprise only one kind of the glass filler, or may comprise two or more kinds. When comprising two or more, it is preferable that a total amount is within the above-mentioned range.

According to the resin composition of the present invention, both of the polycarbonate resin component and the glass filler usually occupy 70% by weight or more in the whole components.

<Laser Direct Structuring Additive>

The LDS additive used in the present invention comprises antimony and tin. The LDS additive used in the present invention means a compound that can form a plated layer, when adding 4 parts by weight of an additive considered as a LDS additive relative to a mixed resin of 60 parts by weight of a polycarbonate resin and 40 parts by weight of ABS, performing irradiation with YAG laser having a wavelength of 1064 nm under the condition of output power of 10 W, frequency of 80 kHz and rate of 3 m/s, then performing metal plating process in an electroless plating bath of M-Copper85 manufactured by MacDermid Co., Ltd, and applying metals to the laser-irradiated surface. The LDS additive used in the present invention may be a synthetic product or a commercially available product. The commercially available product may be a product being put on the market as a LDS additive, or a material which is sold for other uses as long as the requirements of the LDS additive in the present invention are satisfied.

The LDS additive used in the present invention comprises antimony and tin. It is preferable that the LDS additive used in the present invention has a tin content larger than an antimony content, and further preferably the LDS additive comprises antimony oxide and/or tin oxide, and an amount of tin is larger than antimony. Examples of the LDS additives used in the present invention can include antimony-doped tin, antimony-doped tin oxide, and antimony oxide-doped tin oxide.

Particularly, in the present invention, preferable is an LDS additive in which a center portion is composed of a metal oxide and a surface thereof is coated with any one or more of antimony-doped tin, antimony-doped tin oxide, and antimony oxide-doped tin oxide.

A particle size of the LDS additive is preferably 0.01 to 50 more preferably 0.05 to 30 µm. With such a structure, uniformity of plated surface condition tends to be excellent when applying plating.

A blending amount of the LDS additive in the resin composition of the present invention is 5 to 40 parts by weight, preferably 8 to 35 parts by weight, more preferably 10 to 28 parts by weight, and further preferably 15 to 22, relative to 100 parts by weight of the polycarbonate resin component.

The resin composition of the present invention may comprise only one kind of the LDS additive, or may comprise two or more kinds. When comprising two or more, it is preferable that a total amount is within the above-mentioned range.

<Talc>

The resin composition of the present invention may comprise a talc. In the present invention, by blending the talc, plating performance at the portion irradiated with laser tends to be increased.

In addition, the talc used in the present invention is preferable to be a talc surface-treated with at least one kind of a compound selected from polyorganohydrogensiloxanes and organopolysiloxanes (hereinafter may be referred to as "siloxane compound"). In this case, an adhesion amount of the siloxane compound is preferably 0.1 to 5% by weight of the talc. The siloxane compound will be explained specifically in the following.

When the resin composition of the present invention contains the talc, a blending amount of the talc is preferably 1 to 30 parts by weight, more preferably 5 to 28 parts by weight, and further preferably 7 to 22 parts by weight relative to 100 parts by weight of the polycarbonate resin component. When the talc is surface-treated, it is preferable that a total amount of the surface-treated talc is within the above-mentioned range.

<Polyorganohydrogensiloxanes and Organopolysiloxanes>

The resin composition of the present invention may contain a compound selected from polyorganohydrogensiloxanes and organopolysiloxanes (siloxane compound). The siloxane compound may be contained in an aspect in which the surface of the talc is coated as mentioned above, or may be added separately in addition to the talc.

A molecular weight of the siloxane compound is also not particularly limited, and the siloxane compound may be included in any group of oligomers or polymers. More specifically, preferable are the polyorganohydrogensiloxanes represented by the formula (A) to the formula (C) described in JP 63-26140 B, and the hydrocarbon oxisiloxanes represented by the formula (b) described in JP 63-31513 B. The siloxane compound is preferably selected from the polyorganohydrogensiloxanes. For example, a polysiloxane having the following formula (I) as a repeating unit and compounds represented by the formula (II) and the formula (III) are preferably used.

    Formula (I)

in the formula (I), R is a linear or branched alkyl group having 1 to 10 carbon atoms, each of a and b is an integer of 4 or less.

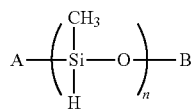    Formula (II)

in the formula (II), each of A and B is a group selected from the following groups, and n is an integer of 1 to 500.

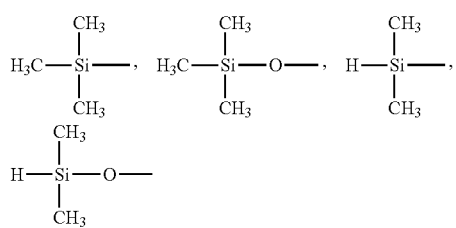

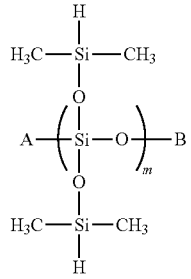    Formula (III)

in the formula (III), each of A and B is the same as each in the formula (II), and m is an integer of 1 to 50.

As the siloxane compound, commercially available products may be used, and for, example, a silicone oil commercially available under the trade name of SH1107 (manufactured by TORAY DOW CORNING SILICONES Co., Ltd.), etc may be used.

When the resin composition of the present invention comprises the siloxane compound, a total blending amount of the siloxane compound is preferably 0.01 to 5 parts by weight, more preferably 0.1 to 3 parts by weight, and further preferably 0.1 to 1 part by weight, relative to 100 parts by weight of the polycarbonate resin component.

<Elastomer>

The composition of the resin composition may comprise an elastomer. By adding the elastomer, the impact resistance of the resin composition is improved.

The elastomer used for the present invention is preferably a graft copolymer produced by graft-copolymerizing rubber component with a monomer component copolymerizable with the rubber component. The graft copolymer may be produced by bulk polymerization, solution polymerization, suspension polymerization or emulsion polymerization. The method of the copolymerization may be a single stage method, or multi stage method.

The rubber component has generally a glass transition temperature of 0° C. or less, preferably −20° C. or less, further preferably −30° C. or less. Specific examples of the rubber component include polyalkylacrylate composite rubber such as polybutadiene rubber, polyisoprene rubber, polybutylacrylate, poly (2-ethylhexylacrylate), and butylacrylate/2-ethylhexylacrylate copolymer, Silicone-based rubbers such as polyorganosiloxane rubber, butadiene-acryl compound rubber, IPN (Interpenetrating Polymer Network) type compound rubber which consists of polyorganosiloxane rubber and polyalkylacrylate rubber, ethylene α-olefin-based rubber such as styrene-butadiene rubber, ethylene-propylene rubber, ethylene-butene rubber, ethylene-octene rubber, ethylene-acryl rubber, and fluoride rubber. They may be used singly or in combination of at least two kinds thereof. Of those, polybutadiene rubber, polyalkylacrylate rubber, IPN type compound rubber which consists of polyorganosiloxane rubber and polyalkylacrylate rubber and styrene-butadiene rubber are preferable from the viewpoints of mechanical properties and surface appearance.

Specific examples of the monomer components graft-copolymerizable with the rubber component include aromatic vinyl compounds, vinyl cyanide compounds, (meth)acrylic acid ester compounds, (meth)acrylic acid compounds and epoxy group-containing (meth)acrylic acid ester compounds such as glycidyl(meth)acrylate; maleimide compounds such as maleimide, N-methyl maleimide and N-phenyl maleimide; α,β-unsaturated carboxylic acid compounds such as maleic acid, phthalic acid and itaconic acid and anhydrides thereof (for example, maleic anhydride, etc.); etc. These monomer components may be used in one kind alone, or in two or more kinds in combination. Of those, from the standpoints of the mechanical properties and the surface appearance, preferable are aromatic vinyl compounds, vinyl cyanide compounds, (meth)acrylic acid ester compounds and (meth)acrylic acid compounds, and more preferable are (meth)acrylic acid ester compounds. Specific examples of the (meth)acrylic acid ester compounds include methyl(meth)acrylate, ethyl(meth)acrylate, butyl(meth)acrylate, cyclohexyl(meth)acrylate, octyl(meth)acrylate, etc. As the graft copolymer for use in the invention, core/shell type graft copolymers are preferable from the standpoints of the impact resistance and the surface appearance. Of those, particularly preferable is a core/shell type graft copolymer comprising a core layer formed from a polybutadiene rubber, a polyorganosiloxane rubber, IPN type compound rubber which consists of polyorganosiloxane rubber and polyalkylacrylate rubber and a shell layer formed by copolymerizing a (meth)acrylic acid ester around the core layer. The above core/shell type graft copolymers comprise preferably 40% by mass or more, more preferably 60% by mass or more, of a rubber component. The core/shell type graft copolymers preferably comprises 10% by mass or more of (meth)acrylic acid. In the core/shell type in the present invention, it is not necessary that the core and shell is clearly distinguished. Compounds obtained by graft-polymerizing the rubber component around the core part are widely included in the core/shell type in the present invention.

Specific examples of preferable graft copolymers include methyl methacrylate-butadiene-styrene copolymer (MBS), methyl methacrylate-acrylonitrile-butadiene-styrene copolymer (MABS), methyl methacrylate-butadiene copolymer (MB), methylacrylate-acrylic rubber copolymer (MA), methylacrylate-acrylic rubber-styrene copolymer (MAS), methylmethacrylate-acryl/butadiene rubber copolymer, methylmethacrylate-acryl/butadiene-styrene copolymer, and methylmethacrylate-(acryl/silicone IPN rubber) copolymer. Such rubber copolymers may be used in one kind alone, or in two or more kinds in combination.

Examples of such graft copolymers include "Paraloid (trade name, hereinafter it the same) EXL2602", "ParaloidEXL2603", "ParaloidEXL2655", "ParaloidEXL2311", "ParaloidEXL2313", "ParaloidEXL2315", "ParaloidKM330", and "ParaloidKM336P", "ParaloidKCZ201", manufactured by Rohm and Haas JAPAN K. K., "Metablen (trade name, hereinafter it the same) C-223A", "Metablen E-901", "Metablen S-2001", and "Metablen SRK-200" manufactured by Mitsubishi Rayon Co., Ltd., "Kane Ace (trade name, hereinafter it the same) M-511", "Kane Ace M-600", "Kane Ace M-400", "Kane Ace M-580", "Kane Ace M-711", and "Kane Ace MR-01", manufactured by Kaneka Corporation, and "UBESTA XPA" manufactured by Ube Industries Ltd.

When the resin composition of the present invention comprises an elastomer, a blending amount of the elastomer is 1 to 20 parts by weight, preferably 5 to 15 parts by weight, and more preferably 8 to 12 parts by weight relative to 100 parts by weight of the polycarbonate resin component.

The resin composition of the present invention may comprise only one kind of the elastomer, or may comprise two or more kinds. When comprising two or more, it is preferable that a total amount is within the above-mentioned range.

<White Pigment>

The polycarbonate resin composition of the present invention may comprise a white pigment. In the present invention, by adding the white pigment, coloring of the resin-molded article can be achieved. Examples of the white pigments include ZnS, ZnO, titanium oxide, and preferable are zinc sulfide and titanium oxide.

Among generally marketed titanium oxides, the titanium oxide comprising 80% by weight or more of a titanium oxide is preferred from the point of whiteness and binding property. The titanium oxides used in the present invention may is exemplified by titanium monoxide (TiO), dititanium trioxide ($Ti_2O_3$), and titanium dioxide ($TiO_2$). Any one thereof can be used, and titanium dioxide is preferably used. The titanium oxide is preferably a titanium oxide having a rutile type crystal structure.

A average primary particle size of the white pigment is preferably 1 μm or less, more preferably 0.001 to 0.5 μm, further more preferably 0.002 to 0.1 μm. With such a particle size and the contents that describe below, the polycarbonate resin which gives a molded article having a high whiteness and a high surface reflectance can be obtained.

When using an inorganic pigment as the white pigment, a surface-treated pigment may be used. The white pigment used in the present invention is preferably a white pigment which is surface-treated with at least one of the siloxane compound. In the case, an adhering amount of the siloxane compound is preferably 0.1 to 5% by weight of the white pigment. As to the siloxane compound, the explanation of the above-mentioned polyorganohydrogensiloxanes and organopolysiloxanes can be referred to, and the preferred ranges are also the same.

As a preferred embodiment of the present invention, there is exemplified a formulation using a titanium oxide surface-treated with at least one kind selected from polyorganohydrogensiloxanes, and organopolysiloxanes.

As the white pigment, commercially available pigments can be used. Furthermore, it may be possible to use one obtained by grinding appropriately a massive pigment or a pigment with large average particle size, and classifying the pigment with a sieve or the like, if necessary, so as to be within the above-mentioned average particle size.

When the polycarbonate resin composition of the present invention comprises the white pigment, a blending amount of the white pigment is preferably 1 to 40 parts by weight, more preferably 3 to 30 parts by weight, and further preferably 5 to 20 parts by weight with respect to 100 parts by weight of the polycarbonate resin.

The polycarbonate resin composition of the present invention may comprise only one kind of the white pigment, or may comprise two or more kinds. When comprising two or more, it is preferable that a total amount is within the above-mentioned range.

<Phosphorus-Based Stabilizer>

The resin composition of the present invention preferably comprises a phosphorus-based stabilizer.

As the phosphorus-based stabilizer, a phosphoric acid ester and a phosphorous acid ester are preferable.

As the phosphoric acid ester, the compound represented by the following general formula (3) is preferable.

General formula (3)

$$O=P(OH)_m(OR)_{3-m} \quad (3)$$

in the general formula (3), R is an alkyl group or an aryl group, and may be the same or different. m is an integer of 0 to 2.

R is preferably an alkyl group having 1 to 25 carbon atoms, or an aryl group having 6 to 12 carbon atoms.

Examples of the phosphoric acid esters include trimethyl phosphate, triethyl phosphate, tributyl phosphate, trioctyl phosphate, triphenyl phosphate, tricresyl phosphate, tris (nonylphenyl) phosphate, 2-ethylphenyl diphenyl phosphate, tetrakis(2,4-di-tert-butylphenyl)-4,4-diphenylenephosphonite and the like.

As the phosphorous acid ester, the compound represented by the following general formula (4) is preferable.

General formula (4)

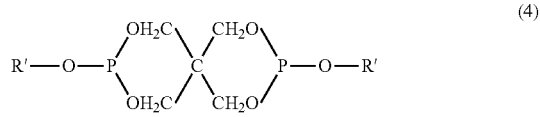

in the general formula (4), R' is an alkyl group or an aryl group, and each may be the same or different.

R' is preferably an alkyl group having 1 to 25 carbon atoms, or an aryl group having 6 to 12 carbon atoms.

Examples of the phosphorous acid esters include a triester of phosphorous acid such as triphenyl phosphite, trisnonylphenyl phosphite, tris(2,4-di-tert-butylphenyl) phosphite, trinonyl phosphite, tridecyl phosphite, trioctyl phosphite, trioctadecyl phosphite, distearylpentaerythritol diphosphite, tricyclohexyl phosphite, monobutyldiphenyl phosphite, monooctyldiphenyl phosphite, bis(2,4-di-tert-butylphenyl) pentaerythritol phosphite, bis(2,6-di-tert-4-methylphenyl) pentaerythritol phosphite, 2,2-methylenebis(4,6-di-tert-butylphenyl)octyl phosphite, a diester, a monoester and the like.

When the resin composition of the present invention comprises the phosphorus-based stabilizer, a blending amount of the phosphorus-based stabilizer is 0.01 to 5 parts by weight, and more preferably 0.05 to 3 parts by weight relative to 100 parts by weight of the polycarbonate resin component.

The resin composition of the present invention may comprise only one kind of the phosphorus-based stabilizer, or may comprise two or more kinds. When comprising two or more, it is preferable that a total amount is within the above-mentioned range.

<Antioxidant>

The resin composition of the present invention may comprise an antioxidant. The antioxidant is preferably a phenol-based antioxidant, and includes more specifically, 2,6-di-t-butyl-4-methylphenol, n-octadecyl-3-(3',5'-di-t-butyl-4'-hydroxyphenyl)propionate, tetrakis[methylene-3-(3,5-di-t-butyl-4-hydroxyphenyl) propionate]methane, tris(3,5-di-t-butyl-4-hydroxybenzyl) isocyanurate, 4,4'-butylydenebis-(3-methyl-6-t-butylphenol), triethylene glycol-bis[3-(3-t-butyl-hydroxy-5-methylphenyl) propionate, and 3,9-bis{2-[3-(3-t-butyl-4-hydroxy-5-methylphenyl)propionyloxi]-1,1-dimethylethyl}-2,4,8,10-tetraoxaspiro[5,5]undecane, etc. Among them, preferable is tetrakis[methylene-3-(3,5-di-t-butyl-4-hydroxyphenyl) propionate] methane.

When the resin composition of the present invention comprises the antioxidant, a blending amount of the antioxidant is 0.01 to 5 parts by weight, and more preferably 0.05 to 3 parts by weight relative to 100 parts by weight of the polycarbonate resin component.

The resin composition of the present invention may comprise only one kind of the antioxidant, or may comprise two or more kinds. When comprising two or more, it is preferable that a total amount is within the above-mentioned range.

<Mold-Releasing Agent>

The resin composition of the present invention may comprise a mold-releasing agent. The mold-releasing agent is preferably at least one kind compound selected from an aliphatic carboxylic acid, an aliphatic carboxylic acid ester, and an aliphatic hydrocarbon compound having a number-average-molecular weight of 200 to 15000. Among them, at least one kind compound selected from the aliphatic carboxylic acid and the aliphatic carboxylic acid ester is more preferably used.

Specific examples of the aliphatic carboxylic acids include a saturated or unsaturated aliphatic mono-carboxylic acid, di-carboxylic acid or tri-carboxylic acid. In the present description, the term of the aliphatic carboxylic acid is used to encompass an alicyclic carboxylic acid. Among the aliphatic carboxylic acids, preferable is a mono- or di-carboxylic acid having 6 to 36 carbon atoms, more preferable is aliphatic saturated mono-carboxylic acid having 6 to 36 carbon atoms. Examples of such aliphatic carboxylic acids include palmitic acid, stearic acid, valeric acid, caproic acid, capric acid, lauric acid, arachic acid, behenic acid, lignoceric acid, cerotic acid, melissic acid, tetrariacontanic acid, montanoic acid, glutaric acid, adipic acid, azelaic acid and the like.

As an aliphatic carboxylic acid component constituting the aliphatic carboxylic acid ester, there can be used the same aliphatic carboxylic acid as mentioned above. In contrast, as an alcohol component constituting the aliphatic carboxylic acid ester, there can be used a saturated or unsaturated mono-alcohol, a saturated or unsaturated polyhydric alcohol and the like. These alcohols may have a substituent such as a fluorine atom or an aryl group. Among these alcohols, preferable is a saturated mono- or polyhydric alcohol having 30 or less carbon atoms, and more preferable is a saturated aliphatic mono-alcohol or polyhydric-alcohol having 30 or less carbon atoms. Here, the aliphatic alcohol also includes an alicyclic alcohol. Specific examples of the alcohols include octanol, decanol, dodecanol, stearyl alcohol, behenyl alcohol, ethylene glycol, diethylene glycol, glycerin, pentaerythritol, 2,2-dihydroxy-perfluoropropanol, neopentylene glycol, ditrimethylolpropane, dipentaerythritol and the like. These aliphatic carboxylic acid esters may contain an aliphatic carboxylic acid and/or alcohol as a contaminant, and may be a mixture of a plurality of compounds. Specific examples of the aliphatic carboxylic acid esters include beeswax (mixture containing myricyl palmitate as a main component), stearyl stearate, behenyl behenate, octyldodecyl behenate, glycerin monopalmitate, glycerin monostearate, glycerin distearate, glycerin tristearate, pentaerythritol monopalmitate, pentaerythritol monostearate, pentaerythritol distearate, pentaerythritol tristearate, pentaerythritol tetrastearate and the like.

When the resin composition of the present invention comprises the mold-releasing agent, an amount of the mold-releasing agent to be blended is 0.01 to 5 parts by weight, and more preferably 0.05 to 3 parts by weight relative to 100 parts by weight of the polycarbonate resin component.

The resin composition of the present invention may comprise only one kind of the mold-releasing agent, or may comprise two or more kinds. When comprising two or more, it is preferable that a total amount is within the above-mentioned range.

The resin composition of the present invention may comprise other components within the scope not departing from the gist of the present invention. Examples of the other components include stabilizers other than the phosphorus-based stabilizer, ultraviolet absorbents, flame retardants, inorganic filler other than talc, fluorescent whiteners, anti-dripping agents, antistatic agents, anticlouding agents, lubricants, antiblocking agents, flowability-improving agents, plasticizers, dispersing agents, antibacterial agents and the like. Two or more of these may be used together.

As to these components, the description of, for example, JP 2007-314766 A, JP 2008-127485 A, JP 2009-51989 A, and JP 2012-72338 A and the like can be referred to, which are incorporated hereto.

In the following, preferred embodiments of the present invention are explained.

(1) A resin composition comprising 35 to 90% by weight (preferably 40 to 60% by weight) of the resin component including 80 to 30% by weight of the polycarbonate resin and 20 to 70% by weight of the styrene-based resin and 0 to 5% by weight of other resin; 5 to 45% by weight (preferably 9 to 39% by weight, more preferably 23 to 36% by weight) of the glass filler; 5 to 15% by weight (preferably 5 to 12% by weight) of the LDS additive; and 2 to 10% by weight (preferably 2 to 6% by weight) of the elastomer.

(2) A resin composition comprising 35 to 90% by weight (preferably 40 to 60% by weight) of the resin component including 80 to 30% by weight of the polycarbonate resin and 20 to 70% by weight of the styrene-based resin and 0 to 5% by weight of other resin; 5 to 45% by weight (preferably 9 to 39% by weight, more preferably 23 to 36% by weight) of the glass filler; 5 to 45% by weight (preferably 9 to 39% by weight, more preferably 23 to 36% by weight) of the glass filler; 5 to 15% by weight (preferably 5 to 12% by weight) of the LDS additive; 2 to 10% by weight (preferably 2 to 6% by weight) of the elastomer; 0.05 to 0.5% by weight of the phosphorus-based stabilizer; 0.05 to 0.3% by weight of the antioxidant; and 0.01 to 0.5% by weight of the mold-releasing agent.

(3) A resin composition comprising 40 to 90% by weight (preferably 45 to 57% by weight) of the polycarbonate resin; 5 to 45% by weight (preferably 9 to 39% by weight, more preferably 23 to 36% by weight) of the glass filler; 5 to 15% by weight (preferably 8 to 12% by weight) of the LDS additive; and 2 to 10% by weight (preferably 2 to 6% by weight) of the elastomer.

(4) A resin composition comprising 40 to 90% by weight (preferably 45 to 57% by weight) of the polycarbonate resin; 5 to 45% by weight (preferably 9 to 39% by weight, more preferably 23 to 36% by weight) of the glass filler; 5 to 15% by weight (preferably 8 to 12% by weight) of the LDS additive; 2 to 10% by weight (preferably 2 to 6% by weight) of the elastomer; 0.05 to 0.5% by weight of the phosphorus-based stabilizer; 0.05 to 0.3% by weight of the antioxidant; and 0.01 to 0.5% by weight of the mold-releasing agent.

(5) A rein composition of any of the above (1) to (4) further comprising 1 to 20% by weight of a white pigment.

(6) A resin composition of the above (5), wherein the white pigment is a titanium oxide surface-treated with at least one kind selected from polyorganohydrogensiloxanes and organopolysiloxanes.

(7) A resin composition of the above (5), wherein the white pigment is zinc sulfide.

(8) A resin composition further comprising 2 to 12% by weight (preferably 4 to 11% by weight) of the talc in the above (1) to (6).

(9) A resin composition further comprising 2 to 12% by weight (preferably 4 to 11% by weight) of the talc surface-treated with at least one kind selected from polyorganohydrogensiloxanes and organopolysiloxanes in the above (1) to (6).

(10) A resin composition of any of the above (1) to (9), wherein a blending amount of other component is 3% by weight or less (preferably 1% by weight or less).

(11) A resin composition of any of the above (1) to (10), wherein the glass filler is a chopped strand.

(12) A resin composition of any of the above (1) to (10), wherein the glass filler is a flat glass fiber.

(13) A resin composition of any of the above (1) to (10), wherein the glass filler is a glass flake of about 3 to 8 μm×about 550 to 650 μm.

(14) A resin composition of any of the above (1) to (13), wherein the phosphorus-based stabilizer is a compound represented by the above-mentioned general formula (3) or (4).

(15) A resin composition of any of the above (1) to (14), wherein the antioxidant is a phenol-based antioxidant (preferably hindered phenol-based antioxidant).

(16) A resin composition of any of the above (1) to (15), wherein the LDS additive is a copper chromium oxide.

(17) A resin composition of any of the above (1), (2) and (4) to (16), wherein the resin component includes substantially 70 to 52% by weight of the polycarbonate resin and 30 to 48% by weight of the styrene-based resin.

(18) A resin composition of any of the above (1), (2) and (4) to (17), wherein the styrene-based resin is an ABS resin.

(19) A portable terminal, smart phone, tablet or personal computer comprising the resin-molded article obtained by molding the resin composition of any of the above (1) to (18).

(20) The portable terminal, smart phone, tablet or personal computer of the above (19), wherein the resin-molded article is white.

The method for preparing the resin composition of the present invention is not particularly defined, and known preparation methods of thermoplastic resin composition can be employed widely. Specifically, the resin composition can be prepared by previously mixing each component through the use of various mixers such as tumbler mixer, Henschel mixer, and then melt-molding with Banbury mixer, roll, Brabender, uniaxial kneading extruder, twin screw kneading extruder, kneader and the like.

Alternatively, for example, the resin composition of the present invention can be prepared by supplying through a feeder to an extruder without pre-mixing of each component or with pre-mixing of partial components, and melt-kneading.

Furthermore, for example, the resin composition of the present invention can also be prepared by pre-mixing a part of the components, supplying it to an extruder, performing melt-kneading to thereby obtain a resin composition that is set as a master batch, mixing again the master batch with the remaining components, and then performing melt-kneading.

The method for manufacturing the resin-molded article from the resin composition of the present invention is not particularly limited, and there can be employed molding method generally used in thermoplastic resins such as, namely, usual injection molding, super high speed injection molding, injection compression molding, two color molding, blow molding including gas-assist, molding by using a heat insulating die, molding by using a rapid heating die, foam molding (including supercritical fluid), insert molding, IMC (in-mold coating molding) molding, extrusion molding, sheet molding, heat molding, rotation molding, laminate molding, and press molding. In addition, there can be selected a molding method using hot-runner system.

Next, a process of providing a plated layer on the surface of the resin-molded article obtained by molding the resin composition of the present invention will be explained according to FIG. 1. FIG. 1 shows a schematic view of a process of forming a plated layer on a surface of a resin-molded article 1 by laser direct structuring technique. In FIG. 1, although the resin-molded article 1 is a flat substrate, the resin-molded article is not necessarily such a flat substrate, and may be partially or totally curved. The resin-molded article comprises not only final products but also various parts. The resin-molded article of the present invention is preferably a mobile electronic device part. The mobile electronic device parts have high impact resistance and rigidity together with excellent heat resistance, and have features of low anisotropy and low warpage, and thus, are extremely suitable for inside components and casing of PDA such as electronic organizer or portable computer; beeper; cellular phone; PHS; and the like. Particularly suitable is a flat plate-like mobile electronic device part having an average thickness excluding rib of 1.2 mm or less (lower limit is not particularly defined and, for example 0.4 mm or more), and among them, most suitable is the casing.

Returning to FIG. 1 again, the resin-molded article 1 is irradiated with laser 2. The laser herein is not particularly defined, and can be appropriately selected from known lasers such as YAG laser, excimer laser, electromagnetic radiations, and preferable is YAG laser. Moreover, a wavelength of the laser is not particularly defined. Preferred wavelength range is 200 nm to 1200 nm. Particularly preferable is 800 nm to 1200 nm.

When irradiated with laser, the resin-molded article 1 is activated at only the portion 3 irradiated with the laser. Under this activated condition, the resin-molded article 1 is applied to a plating solution 4. The plaiting solution 4 is not particularly defined, and known plating solutions can be employed widely, and, as a metal component, a component in which copper, nickel, gold, silver, or palladium is mixed is preferable, and a component in which copper is mixed is more preferable.

The method for applying the resin-molded article 1 to the plating solution 4 is not particularly defined, and, for example, there is a method for throwing the resin-molded article 1 into a liquid with which the plating solution 4 is blended. With respect to the resin-molded article after applying the plating solution, a plated layer 5 is formed only on the portion irradiated with the laser.

According to the method of the present invention, circuit lines having an interval width of 1 mm or less, further 150 µm or less (lower limit is not particularly defined and is, for example, 30 µm or more) can be formed. Such a circuit is preferably used as an antenna of mobile electronic device parts. Namely, one preferred embodiment of the resin-molded article of the present invention is a resin-molded article in which a plated layer provided on the surface of mobile electronic device parts has performance as an antenna.

Example

Hereinafter, the present invention will be more specifically explained by referring to Examples. Materials, amounts to be used, proportions, contents of treatment, procedures for treatment and the like described in the following Examples can be appropriately changed within a scope not departing the gist of the present invention. Accordingly, the scope of the present invention is not limited by the following specific examples.

<Resin Component>
S-3000F: Polycarbonate resin manufactured by Mitsubishi Engineering-Plastics Corporation
AT-08: ABS resin manufactured by NIPPON A&L Inc.
<Glass Filler>
T-571: Chopped strand with 13 µm diameter manufactured by Nippon Electric Glass Co., Ltd.
T-571H: Chopped strand with 10 µm diameter manufactured by Nippon Electric Glass Co., Ltd.
T-571DE: Chopped strand with 6 µm diameter manufactured by Nippon Electric Glass Co., Ltd.
3PA-820: Flat glass fiber with a longer diameter of 28 µm, a shorter diameter of 7 µm (ratio of longer diameter to shorter diameter: 4) manufactured by Nitto Boseki Co., Ltd.
MEG160FYX (0173): Glass flake of 5 µm thickness×longer diameter 600 µm manufactured by Nippon Sheet Glass Co., Ltd.
<LDS Additive>
Iriotec8820: manufactured by Merck, it comprises (Sb/Sn) $O_2$ (36 to 50% by weight), Mica+$SiO_2$ (35 to 53% by weight) and $TiO_2$ (11 to 15% by weight)
Iriotec8825: manufactured by Merck, it comprises (Sb/Sn) $O_2$ (38 to 54% by weight) and Mica (46 to 62% by weight)<
<Talc>
5000S: Hayashi-Kasei co., Ltd
5000S treated with 2% methylhydrogenesiloxane: Hayashi-Kasei co., Ltd
<Siloxane Compound>
SH1107: Methylhydrogenesiloxane manufactured by Dow Corning Toray Co., Ltd.
<Elastomer>
KANEACE M-711: Core/shell type elastomer including butadiene-based core and acrylic shell manufactured by KANEKA CORPORATION
PARALOID EXL2603: Core/shell type elastomer including butadiene-based core and acrylic shell manufactured by Rohm and Hass Company
PARALOID EXL2315: Core/shell type elastomer including acrylic core and acrylic shell manufactured by Rohm and Hass Company
UBESTA XPA: Nylon 12 based thermoplastic elastomer manufactured by UBE INDUSTRIES, LTD.
<White Pigment>
CP-K: manufactured by Resino Color Industry Co., ltd., titanium oxide surface-treated with methyl hydrogensiloxanes
Kronos 2233: manufactured by Kronos, rutile type-titanium dioxide
SACHTORITH L: manufactured by Sachtleben, zinc sulfide
<Phosphorus-Based Stabilizer>
ADEKA Stub AS2112: Tris(2,4-di-tert-butylphenyl)phosphite manufactured by Asahi Denka Kogyo Co., Ltd.
ADEKA Stub AX71: Mixture of approximately equal mole of mono- and di-stearic acid phosphate manufactured by ADEKA CORPORATION
<Antioxidant>
Irganox 1076: Octadecyl-3-(3,5-di-tert-butyl-4-hydroxyphenyl)propionate manufactured by BASF
<Mold-Releasing Agent>
VPG861: Pentaerythritol tetrastearate manufactured by Cognis Oleo Chemicals Japan
<Compound for Examples 1-1 to 1-23 and Comparative Examples 1-1 to 1-4>

The components each were weighted so as to be the composition as shown in the Tables that listed below, were mixed in a tumbler for 20 minutes, and then feed to TEX30HSST with one vent which is manufactured from The Japan Steel Works, Ltd., and kneaded under the condition that the screw rotation number was 200 rpm, the discharge rate is 20 kg/hour, and the barrel temperature was 280° C. and the molten resin was extruded to form strand forms, quenched in water cistern, and then, were pelletized, there by, the pellets of the resin composition were obtained.

<Compound for Examples 2-1 to 2-20 and Comparative Examples 2-1 to 2-6>

Compound for Examples 2-1 to 2-20 and Comparative Examples 2-1 to 2-6 were carried out as the same manner as that in the above compound for Examples 1-1 to 1-23 and Comparative Examples 1-1 to 1-6, except that the barrel temperature was changed 280° C. to 300° C.

In the composition comprising the above SACHTORITH L, the SACHTORITH L was added to the composition as a master batch wherein the SACHTORITH L is added to powders of polycarbonate resin and 3% of SH1107.

<Preparation of Test Piece—ISO Dumbbell Test Piece for Examples 1-1 to 1-23 and Comparative Examples 1-1 to 1-4>

After drying, at 100° C. for 5 hours, the pellets obtained by the above-mentioned preparation method, injection-molding was performed for the formation of a dumbbell test piece of 4 mmt and 3 mmt, under the conditions of a cylinder temperature of 280° C., a mold temperature of 80° C., and a molding cycle of 50 seconds through the use of SG75-MII manufactured by Nissei Plastic Industrial Co., Ltd.

<Preparation of Test Piece—ISO Dumbbell Test Piece for Examples 2-1 to 2-20 and Comparative Examples 2-1 to 2-6>

After drying, at 120° C. for 5 hours, the pellets obtained by the above-mentioned preparation method, injection-molding was performed for the formation of a dumbbell test piece of 4 mmt and 3 mmt, under the conditions of a cylinder temperature of 300° C., a mold temperature of 100° C., and a molding cycle of 50 seconds through the use of SG75-MII manufactured by Nissei Plastic Industrial Co., Ltd.

<Preparation of Test Piece-Two-Stage Plate of 2 mmt/3 mmt for Examples 1-1 to 1-23 and Comparative Examples 1-1 to 1-4>

After drying, at 100° C. for 5 hours, the pellets obtained by the above-mentioned preparation method, injection-molding was performed for the formation of a two-stage plate of 2 mmt/3 mt, under the conditions of a cylinder temperature of 280° C., a mold temperature of 80° C., and a molding cycle of 30 seconds through the use of J-50 manufactured by Nissei Plastic Industrial Co., Ltd.

<Preparation of Test Piece-Two-Stage Plate of 2 mmt/3 mmt for Examples 2-1 to 2-20 and Comparative Examples 2-1 to 2-6>

After drying, at 120° C. for 5 hours, the pellets obtained by the above-mentioned preparation method, injection-molding was performed for the formation of a two-stage plate of 2 mmt/3 mt, under the conditions of a cylinder temperature of 300° C., a mold temperature of 100° C., and a molding cycle of 30 seconds through the use of J-50 manufactured by Nissei Plastic Industrial Co., Ltd.

<Bending Strength and Bending Modulus>

In accordance with ISO178, a bending strength (unit: MPa) and a bending modulus (unit: MPa) were measured at 23° C. through the use of the above-mentioned ISO dumbbell test piece (4 mm thickness).

<Charpy Impact Strength>

In accordance with ISO179, through the use of the ISO tensile test piece (3 mm thickness) obtained by the above-mentioned method, charpy impact strength with notches and an charpy impact strength without notches were measured under 23° C. The results are shown in the following Tables.

<LDS Activity—Plating Index>

The laser irradiation was performed with YAG laser having a wavelength of 1064 nm, on the surface of the two-stage plate of 2 mmt/3 mmt, under the condition of output power of 10 W, frequency of 80 kHz and rate of 3 m/s, and followed by being subjected to electroless plating in a plating bath of M-Copper85 manufactured by MacDermid Co., Ltd. The LDS activity was evaluated by a thickness of the copper-plated layer in the following manner.

<Hue-Gray Lightness>

Through the use of a gray scale no-gloss plate manufactured by Mansell, lightness was measured by using a scale of W (white) to BK (black). Gray lightness was shown as the index of white.

<Decomposition-MVR for Examples 1-1 to 1-23 and Comparative Examples 1-1 to 1-4>

MELTINDEXER RF-F01 manufactured by TOYO SEIKI KOGYO CO., LTD. was used. The MVR measurement was carried out under a measurement temperature of 280° C. and a load of 2.16 kgf. When the MVR value was high, it was determined that decomposition happened, which was an index of decomposition degree.

<Decomposition-MVR for Examples 2-1 to 2-20 and Comparative Examples 2-1 to 2-6>

MELTINDEXER RF-F01 manufactured by TOYO SEIKI KOGYO CO., LTD. was used. The MVR measurement was carried out under a measurement temperature of 300° C. and a load of 1.2 kgf. When the MVR value was high, it was determined that decomposition happened, which was an index of decomposition degree.

The results are shown in the following Tables.

TABLE 1

| Kinds | Name | Ex. 1-1 | Ex. 1-2 | Ex. 1-3 | Ex. 1-4 | Ex. 1-5 | Ex. 1-6 | Ex. 1-7 | Ex. 1-8 | Ex. 1-9 | Ex. 1-10 | Ex. 1-11 |
|---|---|---|---|---|---|---|---|---|---|---|---|---|
| PC | S-3000F | 60 | 60 | 60 | 75 | 60 | 50 | 60 | 60 | 60 | 60 | 60 |
| ABS | AT-08 | 40 | 40 | 40 | 25 | 40 | 50 | 40 | 40 | 40 | 40 | 40 |
| Glass Filler | T-571 | 12.5 | 14.3 | 50 | 50 | 50 | 50 | 80 | | | | |
| | T-571H | | | | | | | | 50 | | | |
| | T-571DE | | | | | | | | | 50 | | |
| | 3PA-820 | | | | | | | | | | 50 | |
| | MEG160FYX(0173) | | | | | | | | | | | 50 |
| LDS additive | Iriotec8820 | 12.5 | 14.3 | 16.7 | 16.7 | 16.7 | 16.7 | 20.0 | 16.7 | 16.7 | 16.7 | 16.7 |
| | Iriotec8825 | | | | | | | | | | | |
| Talc | 5000S | | | | | | | | | | | |
| | Talc treated with methyl-hydrogenesiloxane | | | | | | | | | | | |
| Siloxane compound | Methyl-hydrogenesiloxane | | | | | | | | | | | |
| Elastomer | M-711 | | | | | | | | | | | |
| | EXL2315 | | | | | | | | | | | |
| | UBESTA XPA | | | | | | | | | | | |
| | EXL2603 | | | | | | | | | | | |
| White pigment | Titanium oxide surface-treated with methyl-hydrogensiloxanes having rutile structure | | | | | | | | | | | |
| | Kronos 2233 | | | | | | | | | | | |
| | SACHTORITH L | | | | | | | | | | | |
| Phosphorus-based stabilizer | AS2112 | | | | | 0.2 | | | | | | |
| | AX71 | 0.1 | 0.1 | 0.1 | 0.1 | | 0.1 | 0.1 | 0.1 | 0.1 | 0.1 | 0.1 |
| Antioxidant | Irganox 1076 | 0.3 | 0.3 | 0.3 | 0.3 | 0.3 | 0.3 | 0.3 | 0.3 | 0.3 | 0.3 | 0.3 |
| Mold-releasing agent | VPG861 | 0.3 | 0.3 | 0.3 | 0.3 | 0.3 | 0.3 | 0.3 | 0.3 | 0.3 | 0.3 | 0.3 |

TABLE 1-continued

| Kinds | Name | Ex. 1-1 | Ex. 1-2 | Ex. 1-3 | Ex. 1-4 | Ex. 1-5 | Ex. 1-6 | Ex. 1-7 | Ex. 1-8 | Ex. 1-9 | Ex. 1-10 | Ex. 1-11 |
|---|---|---|---|---|---|---|---|---|---|---|---|---|
| Contents | Items | | | | | | | | | | | |
| Mechanical properties | Bending strength | 100 | 140 | 160 | 165 | 165 | 150 | 180 | 165 | 165 | 160 | 160 |
| | Bending modulus | 5100 | 7200 | 9400 | 9500 | 9400 | 8900 | 12000 | 9700 | 10000 | 10000 | 9000 |
| | Charpy impact with notches | 20 | 25 | 30 | 35 | 30 | 30 | 35 | 31 | 31 | 33 | 29 |
| | Charpy impact without notches | 5.5 | 6.5 | 7.5 | 8 | 7.5 | 7.5 | 7 | 7.5 | 7.5 | 8 | 7 |
| LDS activity | Plating Index | 0.59 | 0.59 | 0.59 | 0.6 | 0.59 | 0.5 | 0.56 | 0.6 | 0.6 | 0.65 | 0.6 |
| Hue | Gray lightness | 4.5 | 4.5 | 4.5 | 4.5 | 4.5 | 4.5 | 4 | 4.5 | 4.5 | 4.5 | 4.5 |
| Decomposition | MVR | 9 | 7.5 | 6 | 4 | 7 | 10 | 4 | 6 | 5 | 7 | 6 |

TABLE 2

| Kinds | Name | Ex. 1-12 | Ex. 1-13 | Ex. 1-14 | Ex. 1-15 | Ex. 1-16 | Ex. 1-17 | Ex. 1-18 | Ex. 1-19 | Ex. 1-20 |
|---|---|---|---|---|---|---|---|---|---|---|
| PC | S-3000F | 60 | 60 | 60 | 60 | 60 | 60 | 60 | 60 | 60 |
| ABS | AT-08 | 40 | 40 | 40 | 40 | 40 | 40 | 40 | 40 | 40 |
| Glass Filler | T-571 | 50 | 60 | 60 | 60 | 60 | 60 | 60 | 60 | 66.7 |
| | T-571H | | | | | | | | | |
| | T-571DE | | | | | | | | | |
| | 3PA-820 | | | | | | | | | |
| | MEG160FYX(0173) | | | | | | | | | |
| LDS additive | Iriotec8820 | | 20 | 20 | 20 | 20 | 20 | 20 | | 22.2 |
| | Iriotec8825 | 16.7 | | | | | | | 20 | |
| Talc | 5000S | | | 10 | 10 | | | | | |
| | Talc treated with methyl-hydrogenesiloxane | | 10 | | | 10 | 10 | 10 | 10 | 11.1 |
| Siloxane compound | Methyl-hydrogenesiloxane | | | | 0.3 | | | | | |
| Elastomer | M-711 | | 10 | 10 | 10 | | | | 10 | 11.1 |
| | EXL2315 | | | | | 10 | | | | |
| | UBESTA XPA | | | | | | 10 | | | |
| | EXL2603 | | | | | | | 10 | | |
| White pigment | Titanium oxide surface-treated with methyl-hydrogensiloxanes having rutile structure | | | | | | | | | 11.1 |
| | Kronos 2233 | | | | | | | | | |
| | SACHTORITH L | | | | | | | | | |
| Phosphorus-based stabilizer | AS2112 | | | | | | | | | |
| | AX71 | 0.1 | 0.1 | 0.1 | 0.1 | 0.1 | 0.1 | 0.1 | 0.1 | 0.1 |
| Antioxidant | Irganox 1076 | 0.3 | 0.3 | 0.3 | 0.3 | 0.3 | 0.3 | 0.3 | 0.3 | 0.3 |
| Mold-releasing agent | VPG861 | 0.3 | 0.3 | 0.3 | 0.3 | 0.3 | 0.3 | 0.3 | 0.3 | 0.3 |
| Contents | Items | | | | | | | | | |
| Mechanical properties | Bending strength | 160 | 150 | 145 | 150 | 150 | 150 | 150 | 150 | 145 |
| | Bending modulus | 9400 | 10900 | 10800 | 10900 | 10900 | 10900 | 11000 | 10900 | 11400 |
| | Charpy impact with notches | 28 | 25 | 23 | 25 | 25 | 25 | 23 | 23 | 23 |
| | Charpy impact without notches | 7 | 6 | 6 | 6 | 6 | 6 | 5.5 | 6.5 | 5.5 |
| LDS activity | Plating Index | 0.57 | 0.74 | 0.77 | 0.74 | 0.74 | 0.74 | 0.75 | 0.72 | 0.84 |
| Hue | Gray lightness | 5.5 | 4.5 | 4.5 | 4.5 | 4.5 | 4.5 | 4.5 | 5.5 | 7.5 |
| Decomposition | MVR | 6 | 4.7 | 6 | 4.7 | 4.7 | 4.7 | 5 | 4.7 | 4 |

| Kinds | Name | Ex. 1-21 | Ex. 1-22 | Ex. 1-23 | Com. Ex. 1-1 | Com. Ex. 1-2 | Com. Ex. 1-3 | Com. Ex. 1-4 |
|---|---|---|---|---|---|---|---|---|
| PC | S-3000F | 60 | 60 | 60 | 60 | 60 | 60 | 60 |
| ABS | AT-08 | 40 | 40 | 40 | 40 | 40 | 40 | 40 |
| Glass Filler | T-571 | 75 | 66.7 | 66.7 | 42.8 | 54.5 | 75 | 75 |
| | T-571H | | | | | | | |
| | T-571DE | | | | | | | |
| | 3PA-820 | | | | | | | |
| | MEG160FYX(0173) | | | | | | | |

TABLE 2-continued

| Contents | Items | | | | | | | | |
|---|---|---|---|---|---|---|---|---|---|
| LDS additive | Iriotec8820 | 25 | 22.2 | 22.2 | | | 75 | |
| | Iriotec8825 | | | | | | | 75 |
| Talc | 5000S | | | | | | | |
| | Talc treated with methyl-hydrogenesiloxane | 12.5 | 11.1 | 11.1 | | 18.1 | | |
| Siloxane compound | Methyl-hydrogenesiloxane | | | | | | | |
| Elastomer | M-711 | 12.5 | 11.1 | 11.1 | | 9.1 | | |
| | EXL2315 | | | | | | | |
| | UBESTA XPA | | | | | | | |
| | EXL2603 | | | | | | | |
| White pigment | Titanium oxide surface-treated with methyl-hydrogensiloxanes having rutile structure | 25 | | | | | | |
| | Kronos 2233 | | 11.1 | | | | | |
| | SACHTORITH L | | | 11.1 | | | | |
| Phosphorus-based stabilizer | AS2112 AX71 | 0.1 | 0.1 | 0.1 | 0.1 | 0.1 | 0.1 | 0.1 |
| Antioxidant | Irganox 1076 | 0.3 | 0.3 | 0.3 | 0.3 | 0.3 | 0.3 | 0.3 |
| Mold-releasing agent | VPG861 | 0.3 | 0.3 | 0.3 | 0.3 | 0.3 | 0.3 | 0.3 |

| Contents | Items | | | | | | | | |
|---|---|---|---|---|---|---|---|---|---|
| Mechanical properties | Bending strength | 140 | 145 | 145 | 190 | 150 | 80 | 80 |
| | Bending modulus | 11900 | 11900 | 11400 | 8000 | 9900 | 12000 | 12000 |
| | Charpy impact with notches | 18 | 20 | 25 | 60 | 30 | 15 | 15 |
| | Charpy impact without notches | 4.5 | 5 | 6 | 16 | 8 | 2 | 2 |
| LDS activity | Plating Index | 0.87 | 0.84 | 0.84 | 0 | 0 | 1.2 | 1.2 |
| Hue | Gray lightness | 8.5 | 7.5 | 7 | 9 | 9 | 6 | 5.5 |
| Decomposition | MVR | 3.7 | 6 | 4 | 8 | 6 | 25 | 25 |

TABLE 3

| Kinds | Name | Ex. 2-1 | Ex. 2-2 | Ex. 2-3 | Ex. 2-4 | Ex. 2-5 | Ex. 2-6 | Ex. 2-7 | Ex. 2-8 | Ex. 2-9 | Ex. 2-10 |
|---|---|---|---|---|---|---|---|---|---|---|---|
| PC | S-3000F | 100 | 100 | 100 | 100 | 100 | 100 | 100 | 100 | 100 | 100 |
| Glass Filler | T-571 | 12.5 | 28.6 | 50 | 80 | | | | | 50 | 60 |
| | T-571H | | | | | 50 | | | | | |
| | T-571DE | | | | | | 50 | | | | |
| | 3PA-820 | | | | | | | 50 | | | |
| | MEG160FYX(0173) | | | | | | | | 50 | | |
| LDS additive | Iriotec8820 | 12.5 | 14.3 | 16.7 | 20 | 16.7 | 16.7 | 16.7 | 16.7 | | 20 |
| | Iriotec8825 | | | | | | | | | 16.7 | |
| Talc | 5000S | | | | | | | | | | 10 |
| | Talc treated with methyl-hydrogenesiloxane | | | | | | | | | | |
| Siloxane compound | Methyl-hydrogenesiloxane | | | | | | | | | | |
| Elastomer | M-711 | | | | | | | | | | 10 |
| | EXL2603 | | | | | | | | | | |
| | EXL2315 | | | | | | | | | | |
| | UBESTA XPA | | | | | | | | | | |
| White pigment | Titanium oxide surface-treated with methyl-hydrogensiloxanes having rutile structure | | | | | | | | | | |
| | Kronos 2233 | | | | | | | | | | |
| | SACHTORITH L | | | | | | | | | | |

TABLE 3-continued

| Kinds | Name | Ex. 2-1 | Ex. 2-2 | Ex. 2-3 | Ex. 2-4 | Ex. 2-5 | Ex. 2-6 | Ex. 2-7 | Ex. 2-8 | Ex. 2-9 | Ex. 2-10 |
|---|---|---|---|---|---|---|---|---|---|---|---|
| Phosphorus-based stabilizer | AX71 | 0.1 | 0.1 | 0.1 | 0.1 | 0.1 | 0.1 | 0.1 | 0.1 | 0.1 | 0.1 |
| Antioxidant | IR1076 | 0.3 | 0.3 | 0.3 | 0.3 | 0.3 | 0.3 | 0.3 | 0.3 | 0.3 | 0.3 |
| Mold-releasing agent | VPG861 | 0.3 | 0.3 | 0.3 | 0.3 | 0.3 | 0.3 | 0.3 | 0.3 | 0.3 | 0.3 |

| Contents | Items | | | | | | | | | | |
|---|---|---|---|---|---|---|---|---|---|---|---|
| Mechanical properties | Bending strength | 105 | 140 | 165 | 190 | 170 | 170 | 165 | 165 | 165 | 150 |
| | Bending modulus | 5400 | 7500 | 9700 | 12500 | 10000 | 10300 | 10300 | 9500 | 9700 | 10900 |
| | Charpy impact with notches | 25 | 30 | 35 | 37 | 36 | 36 | 38 | 32 | 35 | 25 |
| | Charpy impact without notches | 6 | 7 | 8 | 8 | 8 | 8 | 9 | 7 | 8 | 6 |
| LDS activity | Plating Index | 0.54 | 0.54 | 0.54 | 0.54 | 0.56 | 0.56 | 0.6 | 0.55 | 0.52 | 0.69 |
| Hue | Gray lightness | 4.5 | 4.5 | 4.5 | 4.5 | 4.5 | 4.5 | 4.5 | 4.5 | 5.5 | 4.5 |
| Decomposition | MVR | 8 | 7 | 4.5 | 3 | 4.5 | 4 | 5 | 4.5 | 4.5 | 3.3 |

TABLE 4

| Kinds | Name | Ex. 2-11 | Ex. 2-12 | Ex. 2-13 | Ex. 2-14 | Ex. 2-15 | Ex. 2-16 |
|---|---|---|---|---|---|---|---|
| PC | S-3000F | 100 | 100 | 100 | 100 | 100 | 100 |
| Glass Filler | T-571 | 60 | 60 | 60 | 60 | 60 | 60 |
| | T-571H | | | | | | |
| | T-571DE | | | | | | |
| | 3PA-820 | | | | | | |
| | MEG160FYX(0173) | | | | | | |
| LDS additive | Iriotec8820 | 20 | 20 | 20 | 20 | 20 | |
| | Iriotec8825 | | | | | | 20 |
| Talc | 5000S | 10 | 10 | | | | |
| | Talc treated with methyl-hydrogenesiloxane | | | 10 | 10 | 10 | 10 |
| Siloxane compound | Methyl-hydrogenesiloxane | | 0.3 | | | | |
| Elastomer | M-711 | 10 | 10 | | | | 10 |
| | EXL2603 | | | 10 | | | |
| | EXL2315 | | | | 10 | | |
| | UBESTA XPA | | | | | 10 | |
| White pigment | Titanium oxide surface-treated with methyl-hydrogensiloxanes having rutile structure | | | | | | |
| | Kronos 2233 | | | | | | |
| | SACHTORITH L | | | | | | |
| Phosphorus-based stabilizer | AX71 | 0.1 | 0.1 | 0.1 | 0.1 | 0.1 | 0.1 |
| Antioxidant | IR1076 | 0.3 | 0.3 | 0.3 | 0.3 | 0.3 | 0.3 |
| Mold-releasing agent | VPG861 | 0.3 | 0.3 | 0.3 | 0.3 | 0.3 | 0.3 |

| Contents | Items | | | | | | |
|---|---|---|---|---|---|---|---|
| Mechanical properties | Bending strength | 145 | 150 | 150 | 150 | 150 | 150 |
| | Bending modulus | 10800 | 10900 | 10900 | 10900 | 11400 | 10900 |
| | Charpy impact with notches | 23 | 25 | 25 | 25 | 25 | 23 |
| | Charpy impact without notches | 6 | 6 | 6 | 5.8 | 5.5 | 6.5 |
| LDS activity | Plating Index | 0.72 | 0.69 | 0.69 | 0.69 | 0.69 | 0.67 |
| Hue | Gray lightness | 4.5 | 4.5 | 4.5 | 4.5 | 4.5 | 5.5 |
| Decomposition | MVR | 4.5 | 3.3 | 3.3 | 3.5 | 4 | 3.3 |

TABLE 4-continued

| Kinds | Name | Ex. 2-17 | Ex. 2-18 | Ex. 2-19 | Ex. 2-20 |
|---|---|---|---|---|---|
| PC | S-3000F | 100 | 100 | 100 | 100 |
| Glass Filler | T-571 | 66.7 | 75 | 66.7 | 66.7 |
| | T-571H | | | | |
| | T-571DE | | | | |
| | 3PA-820 | | | | |
| | MEG160FYX(0173) | | | | |
| LDS additive | Iriotec8820 | 22.2 | 25 | 22.2 | 22.2 |
| | Iriotec8825 | | | | |
| Talc | 5000S | | | | |
| | Talc treated with methyl-hydrogensiloxane | 11.1 | 12.5 | 11.1 | 11.1 |
| Siloxane compound | Methyl-hydrogensiloxane | | | | |
| Elastomer | M-711 | 11.1 | 12.5 | 11.1 | 11.1 |
| | EXL2603 | | | | |
| | EXL2315 | | | | |
| | UBESTA XPA | | | | |
| White pigment | Titanium oxide surface-treated with methyl-hydrogensiloxanes having rutile structure | 11.1 | 25 | | |
| | Kronos 2233 | | | 11.1 | |
| | SACHTORITH L | | | | 11.1 |
| Phosphorus-based stabilizer | AX71 | 0.1 | 0.1 | 0.1 | 0.1 |
| Antioxidant | IR1076 | 0.3 | 0.3 | 0.3 | 0.3 |
| Mold-releasing agent | VPG861 | 0.3 | 0.3 | 0.3 | 0.3 |

| Contents | Items | | | | |
|---|---|---|---|---|---|
| Mechanical properties | Bending strength | 145 | 140 | 145 | 145 |
| | Bending modulus | 11400 | 11900 | 11900 | 11400 |
| | Charpy impact with notches | 23 | 18 | 20 | 25 |
| | Charpy impact without notches | 5.5 | 4.5 | 5 | 6 |
| LDS activity | Plating Index | 0.79 | 0.82 | 0.79 | 0.79 |
| Hue | Gray lightness | 7.5 | 8.5 | 7.5 | 7 |
| Decomposition | MVR | 3 | 2.8 | 4.5 | 3 |

TABLE 5

| Kinds | Name | Com. Ex. 2-1 | Com. Ex. 2-2 | Com. Ex. 2-3 | Com. Ex. 2-4 | Com. Ex. 2-5 | Com. Ex. 2-6 |
|---|---|---|---|---|---|---|---|
| PC | S-3000F | 100 | 100 | 100 | 100 | 100 | 100 |
| Glass Filler | T-571 | 0 | 125 | 42.3 | 54.5 | 75 | 75 |
| | T-571H | | | | | | |
| | T-571DE | | | | | | |
| | 3PA-820 | | | | | | |
| | MEG160FYX(0173) | | | | | | |
| LDS additive | Iriotec8820 | 11.1 | 25 | | | 75 | |
| | Iriotec8825 | | | | | | 75 |
| Talc | 5000S | | | | | | |
| | Talc treated with methyl-hydrogensiloxane | | | | 18.1 | | |
| Siloxane compound | Methyl-hydrogensiloxane | | | | | | |
| Elastomer | M-711 | | | | 9.1 | | |
| | EXL2603 | | | | | | |
| | EXL2315 | | | | | | |
| | UBESTA XPA | | | | | | |
| White pigment | Titanium oxide surface-treated with methyl-hydrogensiloxanes having rutile | | | | | | |

TABLE 5-continued

| Kinds | Name | Com. Ex. 2-1 | Com. Ex. 2-2 | Com. Ex. 2-3 | Com. Ex. 2-4 | Com. Ex. 2-5 | Com. Ex. 2-6 |
|---|---|---|---|---|---|---|---|
| | structure Kronos 2233 SACHTORITH L | | | | | | |
| Phosphorus-based stabilizer | AX71 | 0.1 | 0.1 | 0.1 | 0.1 | 0.1 | 0.1 |
| Antioxidant | IR1076 | 0.3 | 0.3 | 0.3 | 0.3 | 0.3 | 0.3 |
| Mold-releasing agent | VPG861 | 0.3 | 0.3 | 0.3 | 0.3 | 0.3 | 0.3 |
| Contents | Items | | | | | | |
| Mechanical properties | Bending strength | 105 | 200 | 190 | 150 | 90 | 90 |
| | Bending modulus | 3200 | 17000 | 8000 | 9900 | 13000 | 13000 |
| | Charpy impact with notches | 35 | 30 | 60 | 30 | 15 | 15 |
| | Charpy impact without notches | 9 | 6 | 16 | 8 | 2 | 2 |
| LDS activity | Plating Index | 0.8 | 0.5 | 0 | 0 | 1.2 | 1.2 |
| Hue | Gray lightness | 4.5 | 4.5 | 9 | 9 | 6 | 5.5 |
| Decomposition | MVR | 15 | 1.5 | 6 | 4.5 | 15 | 15 |

As is clear from the above Tables, it has been found that the compositions of the present invention were excellent in various mechanical properties, and also excellent in the LDS activity. In contrast, the compositions of Comparative Examples were inferior in the mechanical properties or had less LDS activity.

The present disclosure relates to the subject matter contained in Japanese Patent Application No. 128619/2012 filed on Jun. 6, 2012 and Japanese Patent Application No. 128621/2012 filed on Jun. 6, 2012, which are expressly incorporated herein by reference in their entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

The invention claimed is:

1. A resin composition for laser direct structuring, comprising, relative to 100 parts by weight of a polycarbonate resin component, 10 to 100 parts by weight of a glass filler, 5 to 40 parts by weight of a laser direct structuring additive, and 1 to 20 parts by weight of an elastomer, wherein the elastomer is a core/shell graft copolymer,
wherein the polycarbonate resin component consists of 100 to 30% by weight of a polycarbonate resin and 0 to 70% by weight of a styrene-based resin;
the laser direct structuring additive comprises antimony and tin; and
wherein the laser direct structuring additive has a tin content larger than an antimony content.

2. The resin composition for laser direct structuring according to claim 1, wherein the polycarbonate resin component consists of 80 to 30% by weight of a polycarbonate resin and 20 to 70% by weight of a styrene-based resin, or consists of a polycarbonate resin.

3. The resin composition for laser direct structuring according to claim 1, further comprising 1 to 30 parts by weight of a talc, relative to 100 parts by weight of the polycarbonate resin component.

4. The resin composition for laser direct structuring according to claim 1, further comprising 0.01 to 5 parts by weight of at least one kind selected from polyorganohydrogensiloxanes and organopolysiloxanes, relative to 100 parts by weight of the polycarbonate resin component.

5. The resin composition for laser direct structuring according to claim 1, further comprising 1 to 30 parts by weight of a talc surface-treated with at least one kind selected from polyorganohydrogensiloxanes and organopolysiloxanes, relative to 100 parts by weight of the polycarbonate resin component.

6. The resin composition for laser direct structuring according to claim 1, wherein the glass filler is at least one kind selected from a glass fiber and a plate-like glass.

7. The resin composition for laser direct structuring according to claim 1, wherein the glass filler is at least one kind selected from a glass flake and a flat glass fiber.

8. The resin composition for laser direct structuring according to claim 1, further comprising 1 to 40 parts by weight of a white pigment, relative to 100 parts by weight of the polycarbonate resin component.

9. The resin composition for laser direct structuring according to claim 8, wherein the white pigment is titanium oxide and/or zinc sulfide.

10. The resin composition for laser direct structuring according to claim 1, further comprising 0.01 to 5 parts by weight of a phosphorus-based stabilizer, relative to 100 parts by weight of the polycarbonate resin component.

11. A resin-molded article obtained by molding the resin composition for laser direct structuring according to claim 1.

12. The resin-molded article according to claim 11, further comprising a plated layer on a surface of the article.

13. The resin-molded article according to claim 11, which is a mobile electronic device part.

14. The resin-molded article according to claim 12, wherein the plated layer has a performance as an antenna.

15. A method for manufacturing a resin-molded article with a plated layer, irradiating, with laser, a surface of the resin-molded article obtained by molding the resin composition for laser direct structuring according to claim 1, and applying a metal on the surface to form the plated layer.

16. The method for manufacturing a resin-molded article with a plated layer according to claim 15, wherein the plating is copper plating.

17. A method for manufacturing a mobile electronic device part having an antenna, comprising the method for manufacturing a resin-molded article with a plated layer according to claim 15.

\* \* \* \* \*